United States Patent [19]
Ibok et al.

[11] Patent Number: 5,940,718
[45] Date of Patent: Aug. 17, 1999

[54] NITRIDATION ASSISTED POLYSILICON SIDEWALL PROTECTION IN SELF-ALIGNED SHALLOW TRENCH ISOLATION

[75] Inventors: Effiong Ibok, Sunnyvale; Yue-Song He; Yowjuang W. Liu, both of San Jose, all of Calif.

[73] Assignee: Advanced Micro Devices, Sunnyvale, Calif.

[21] Appl. No.: 09/119,715

[22] Filed: Jul. 20, 1998

[51] Int. Cl.⁶ .................................................... H01L 21/76
[52] U.S. Cl. .......................... 438/440; 438/444; 438/445; 257/506
[58] Field of Search .................................... 438/424, 440, 438/444, 445, 775, 513; 257/506

[56] References Cited

U.S. PATENT DOCUMENTS

| | | | |
|---|---|---|---|
| 4,855,258 | 8/1989 | Allman et al. | 438/445 |
| 5,229,318 | 7/1993 | Straboni et al. | 438/694 |
| 5,248,350 | 9/1993 | Lee | 438/445 |
| 5,719,086 | 2/1998 | Kim et al. | 438/445 |
| 5,747,376 | 5/1998 | Lee | 438/444 |
| 5,747,866 | 5/1998 | Ho et al. | 257/506 |
| 5,811,315 | 3/1997 | Yindeepol et al. | 438/445 |
| 5,834,360 | 7/1996 | Tesauro et al. | 438/445 |
| 5,838,056 | 12/1996 | Kasai et al. | 438/775 |

*Primary Examiner*—Charles Bowers
*Assistant Examiner*—David S Blum
*Attorney, Agent, or Firm*—LaRiviere, Grubman & Payne, LLP

[57] ABSTRACT

A method for fabricating a semiconductor device including a silicon substrate and plural silicon stacks thereon includes forming a nitride shield layer on the substrate and stacks to cover the stacks, such that the stacks are protected from loss of critical dimension during subsequent isolation trench formation and oxidation. In other words, the edge of each stack, and thus the critical dimension of the silicon layers of the stack, is protected from oxidation by the nitride shield layer.

17 Claims, 4 Drawing Sheets

NITRIDATION ASSISTED POLYSILICON SIDEWALL PROTECTION IN SELF-ALIGNED SHALLOW TRENCH ISOLATION

TECHNICAL FIELD

The present invention relates to the fabrication of semiconductor devices, and more particularly to fabricating ultra-large scale integration (ULSI) semiconductors in which the critical dimensions of various layers of the fabricated semiconductor products are preserved.

BACKGROUND OF THE INVENTION

Semiconductor chips or wafers are used in many applications, including as integrated circuits and as flash memory for hand held computing devices, wireless telephones, and digital cameras. Regardless of the application, it is desirable that a semiconductor chip hold as many circuits or memory cells as possible per unit area. In this way, the size, weight, and energy consumption of devices that use semiconductor chips advantageously is minimized, while nevertheless improving the memory capacity and computing power of the devices.

In chips that hold integrated circuits, the individual circuit components such as transistors are interconnected by conductive elements referred to as "interconnect lines". These interconnect lines are typically arranged in a multi-layered pattern that is deposited on a semiconductive substrate such as silicon. To insulate the interconnect lines from each other, insulative material is deposited between adjacent interconnect line layers.

With the above in mind, so-called 0.25 micron technology has been developed, in which the distance between adjacent layers of interconnect lines and in which the size of circuit components in an integrated circuit on a semiconductor chip is minimized (on the order of a fraction of a micron). With such a small spacing between interconnect lines, the size of the circuits on the chip can be reduced to result in the above-noted advantages.

It can readily be appreciated that it is important to electrically isolate various components of an integrated circuit from each other, to prevent short circuits and thereby ensure proper circuit operation. Accordingly, methods have been introduced to isolate circuit components, such as transistors, from each other.

Among the isolation methods that are used are junction isolation, dielectric isolation, and air isolation (often referred to as beam-lead technology). Of importance to the present invention is dielectric isolation, one form of which is so-called shallow trench isolation (STI), in which trenches are formed in the substrate of a chip by etching, to isolate the components next to the trench. Oxidation layers are then formed in the trenches to provide for further isolation. As recognized herein, STI inherently facilitates sub-micron technology, because it facilitates the isolation of very small chip components on a comparatively dense semiconductor chip.

The present invention understands that these small chip components must retain certain dimensions, referred to as "critical dimensions", to function properly. Unfortunately, it can be the case that during fabrication, and particularly during isolation trench etching and trench oxidation, portions of the chip components unintentionally can be removed or oxidized along with the silicon substrate areas that are sought to be removed or oxidized for purposes of trench formation. This potentially diminishes one or more critical dimensions of the affected chip components. As still further understood herein, the problem of reducing a chip component beyond a critical dimension is exacerbated in sub-micron fabrication processes, in which the chip components are designed with very small dimensions and consequently in which even a small etching away or oxidation of a component or portion thereof can render the component useless for its intended purpose.

Fortunately, the present invention recognizes that it is possible to oxidize isolation trenches in quarter micron technology semiconductors, without reducing component sizes below their critical dimensions. The benefits provided herein increase semiconductor product yield and reliability.

BRIEF SUMMARY OF THE INVENTION

A method for making a semiconductor device includes providing a silicon substrate and establishing plural component stacks on the substrate, with at least some stacks defining respective side edges. Protective nitride layers are formed on the edges of the stacks. Then, isolation trenches in the substrate are oxidized to electrically isolate the stacks from each other, with the nitride layers protecting the stack side walls from oxidation and, hence, from loss of critical dimension.

In a preferred embodiment, isolation trenches are etched into the substrate between adjacent stacks, and the nitride layers are formed by implanting nitrogen into the stacks either before or after the isolation trenches are formed, but in any case before trench oxidation. In a particularly preferred embodiment, the forming step includes rapid thermal annealing (RTA), and it also includes directing at least one plasma beam into the side edges of the stacks. The plasma beam establishes an angle with respect to a dimension normal to the substrate of between fifteen degrees and seventy five degrees (15°–75°), and more preferably at an angle of about sixty degrees (60°). A semiconductor device made according to the present method, as well as a computing device incorporating the semiconductor device, are also disclosed.

In another aspect, a method is disclosed for fabricating a semiconductor device including a silicon substrate and plural stacks formed thereon. The stacks include respective silicon layers in operative combination with the silicon substrate and defining respective side edges, and isolation trenches are formed between adjacent stacks. In accordance with the present invention, the method includes implanting a shield layer containing nitrogen in the side edges of the silicon layers to protect the edges, and then oxidizing the isolation trench. With this combination of steps, the shield layer protects the edges of the silicon layers during trench oxidation.

In still another aspect, a semiconductor device includes a silicon substrate, at least one isolation trench in the substrate, and a silicon layer in operative combination with the silicon substrate and juxtaposed with the isolation trench. The silicon layer defines an edge, and a shield layer containing nitrogen protects the edge of the silicon layer from oxidation.

Other features of the present invention are disclosed or apparent in the section entitled "DETAILED DESCRIPTION OF THE INVENTION".

BRIEF DESCRIPTION OF DRAWINGS

For understanding of the present invention, reference is made to the accompanying drawing in the following DETAILED DESCRIPTION OF THE INVENTION. In the drawings.

DETAILED DESCRIPTION OF THE INVENTION

Figure 1:
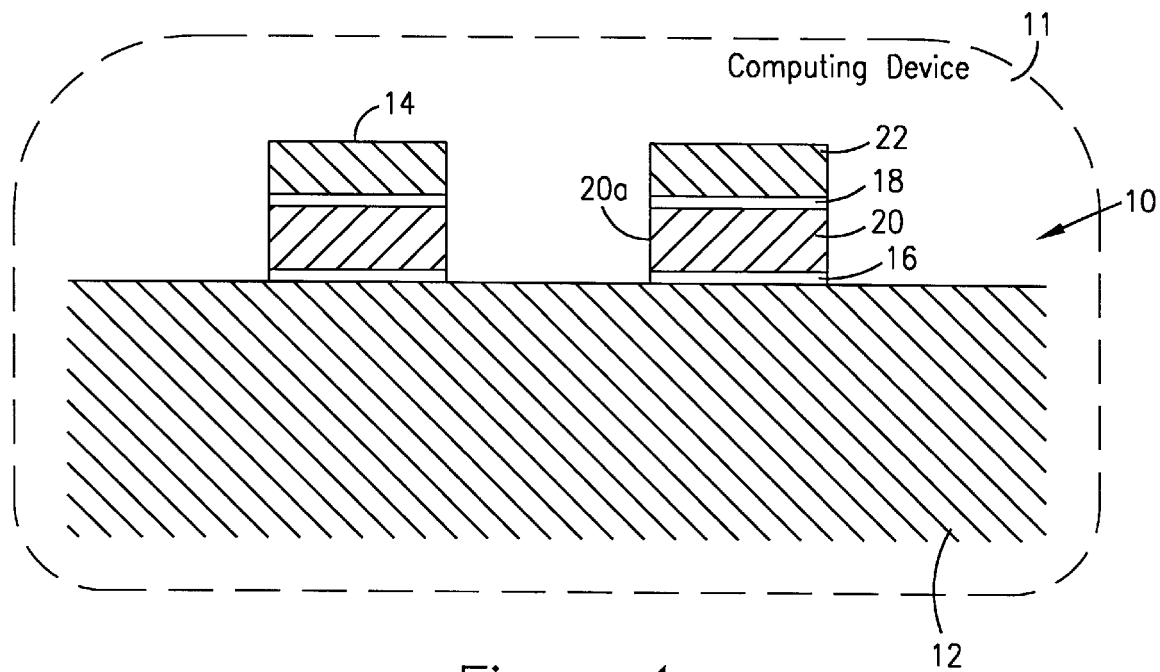
FIG. 1 is a cross-sectional representation of a semiconductor device from the bit line direction, prior to trench formation, with a computing device that incorporates the semiconductor device schematically shown in phantom.

Referring initially to FIG. 1, a semiconductor device is shown, generally designated 10, that can be incorporated into a computer or computing device 11. As intended by the present invention, the computing device 11 can be, e.g., a computer, digital camera, wireless telephone, or hand held computer.

As shown in FIG. 1, the semiconductor device 10 includes a silicon substrate 12 having disposed thereon plural so-called component stacks 14. It is to be understood that the present nitridization passivation can be implemented on substantially any semiconductor device on a silicon substrate which has applied thereto at least one silicon layer, as described below.

In the particular embodiment shown, each stack 14 includes a high temperature oxide (HTO) barrier oxide or tunnel layer 16 adjacent the substrate 12, a second HTO layer 18 or oxide nitride oxide (ONO) layer spaced from and parallel to the barrier oxide layer 16, and at least one polysilicon layer 20 sandwiched between the layers 16, 18. A silicon nitride mask layer 22 covers the second HTO layer 18. It is to be understood that each stack 14 can be part of a gate structure of a semiconductor component such as are found in non-volatile memory devices. It is to be further understood that the stacks 14 are so-called self-aligned stacks. In any case, each stack 14 includes at least one silicon layer, such as the polysilicon layer 20, that defines a respective sidewall edge 20a sought to be protected during isolation trench formation and/or isolation trench oxidation.

Figure 3:
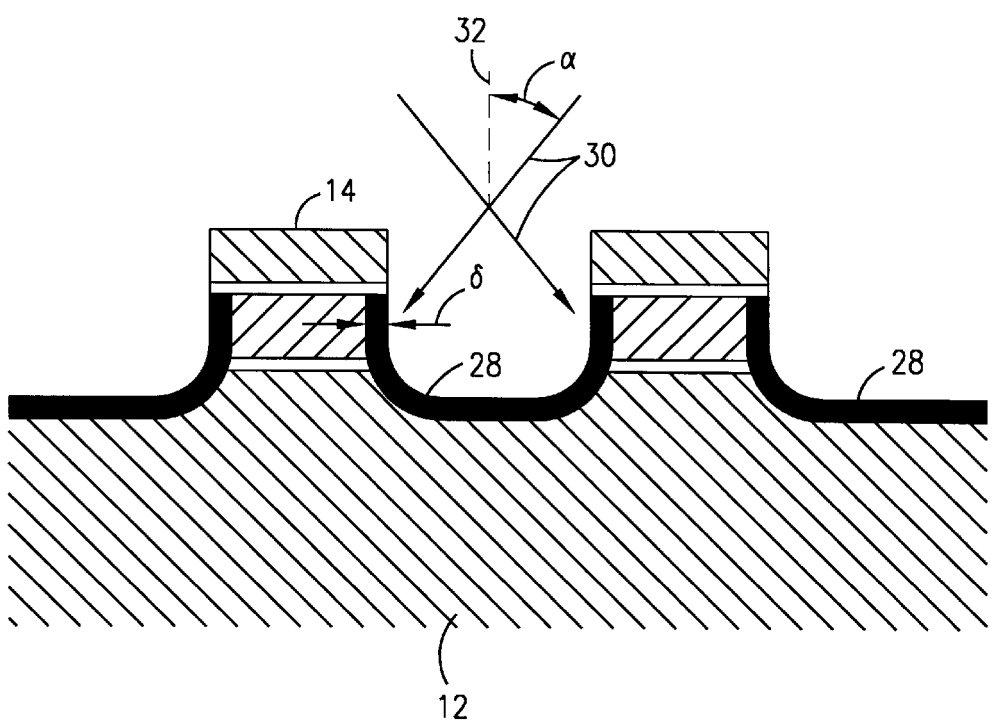
FIG. 3 is a cross-sectional representation of the semiconductor device after nitridization.
Figure 2:
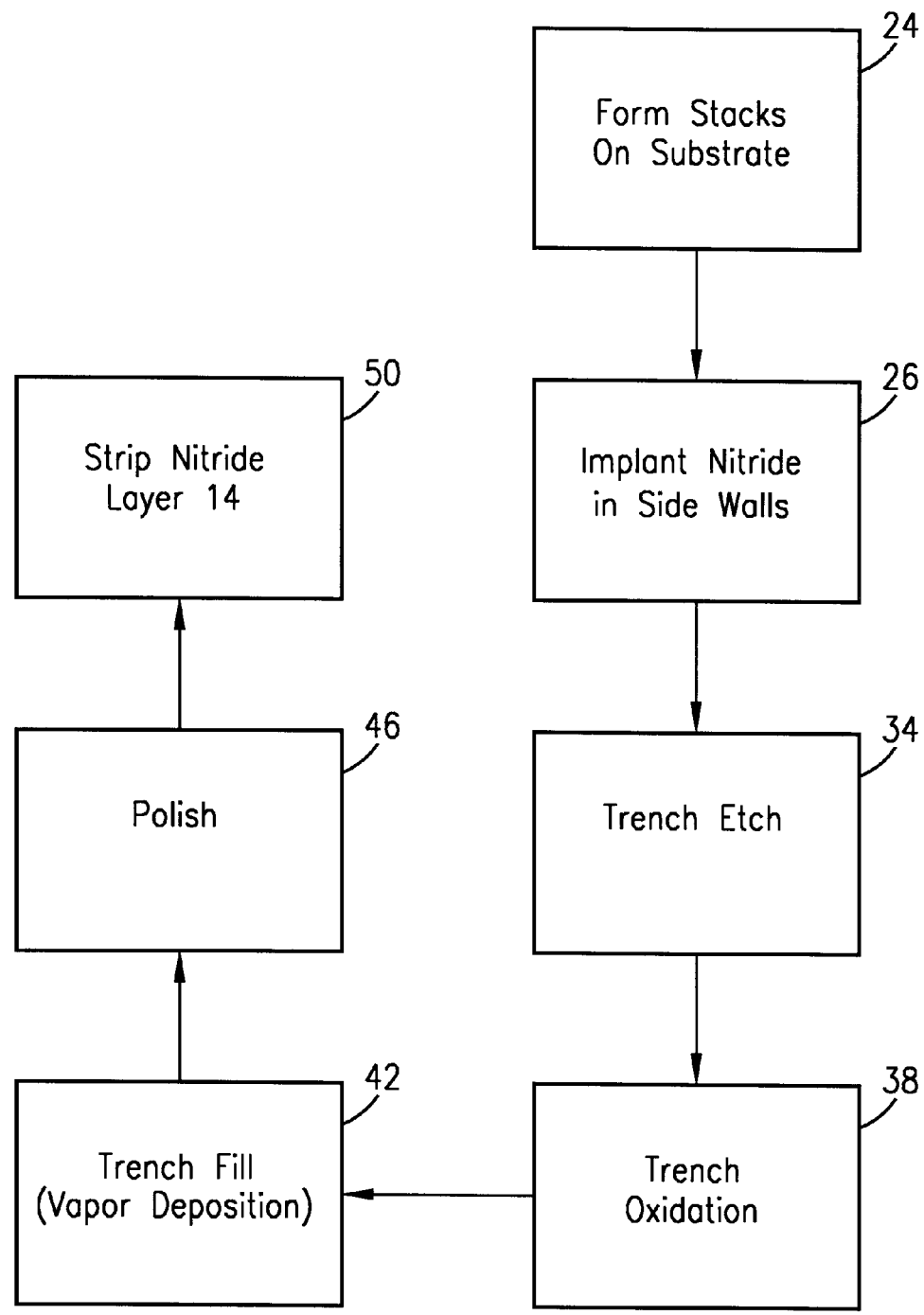
FIG. 2 is a flow chart of the present process.

Cross-referencing FIGS. 1, 2, and 3, the stack formation step that arrives at the stacks 14 described above is shown at block 24 in the flow chart of FIG. 2. As intended by the present invention, the stacks 14 and substrate 12 can be rendered into the configuration shown in FIG. 1 by techniques known in the ultra-large scale integration (ULSI) semiconductor art.

After stack 14 formation, the process moves to block 26 of FIG. 2, wherein a shield layer 28 including nitrogen is implanted into the side walls of the stacks 14 and onto the surface of the substrate 12, as best shown in FIG. 3. In the preferred embodiment, the shield layer 28 is implanted by rapid thermal anneal (RTA) with plasma nitridization to a depth δ of about 0–2000 Å, and more particularly from about 5 Å–50 Å; and more particularly still to a depth δ of about 20 Å. After processing, the shield layer is a nitride shield layer.

The plasma beam paths from a plasma source to the semiconductor device 10 are represented in FIG. 3 by arrows 30. As shown, each plasma beam path 30 preferably establishes an angle a with respect to the vertical dimension 32 (i.e., the dimension that is normal to the surface of the substrate 12 on which the stacks 14 are formed). The angle a is between 0–90°, and more preferably is between 15–75°, and more preferably still is about 60°.

Figure 4:
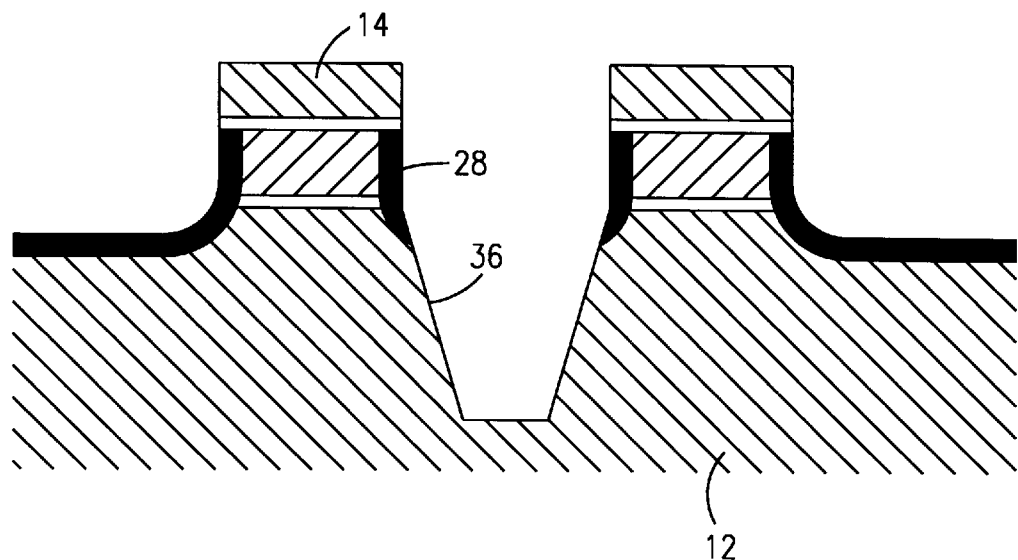
FIG. 4 is a cross-sectional representation of the semiconductor device after trench formation.

Moving to block 34 of FIG. 2 and now referring to FIG. 4, after the sidewalls of the stacks 14 have been implanted with nitrogen, isolation trenches 36 are formed in the substrate 12 between adjacent stacks 14, to electrically isolate the stacks 14 from each other (only a single trench 36 shown for clarity of disclosure). The etching step at block 34 is undertaken using trench etching processes known in the art, e.g., resist masking, followed by photolithography and then wet etching or plasma etching. When nitridization is undertaken before trench etching as set forth above, the nitride shield layer 28 protects the sidewalls of the stacks 14, and in particular the edges 20a of the polysilicon layer 20, from losing critical dimension during the etching step.

Figure 5:
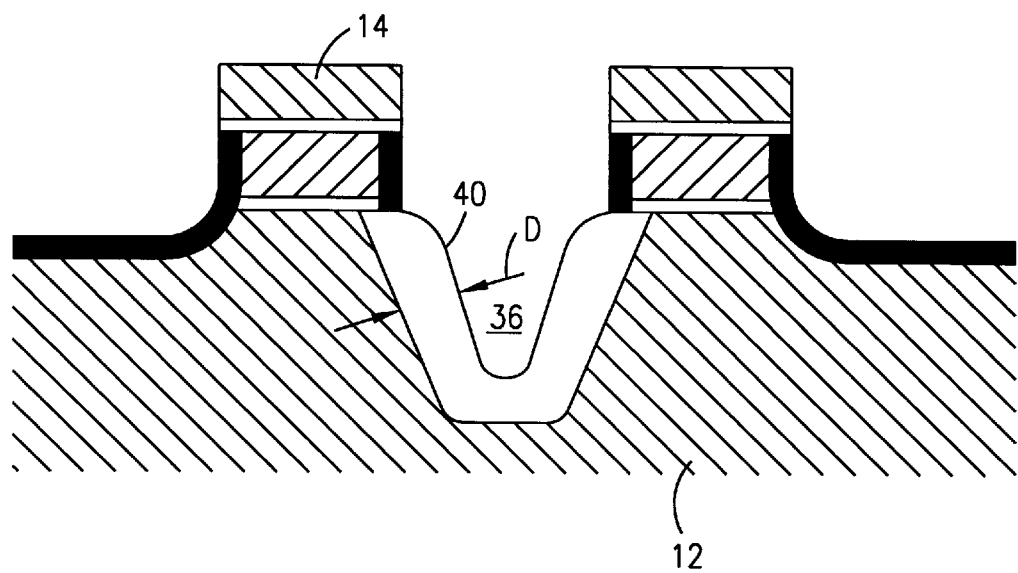
FIG. 5 is a cross-sectional representation of the semiconductor device after trench oxidation.

Proceeding to block 38 in FIG. 2 and referring now to FIG. 5, a relatively thick insulating silicon oxide layer 40 is formed on the wall of each isolation trench 36 by means known in the art, to further electrically insulate adjacent stacks 14 from each other. Owing to the protection provided by the passivation (from nitridization) of the silicon layers 20 of each stack 14, the silicon oxide layer 40 in each isolation trench 36 can be formed to a relatively deep depth "D" of around 2000 Å, substantially without oxidizing the polysilicon layers 20 and, hence, substantially without losing critical dimension of the polysilicon layers 20 during oxide layer 40 formation.

Alternatively, if desired the steps shown at blocks 26 and 34 of FIG. 2 can be reversed, i.e., the trenches 36 can be formed, then the nitride shield layer 28 implanted into the stacks 14 and trenches 36, and then the trenches 36 oxidized to form the oxide layer 40. In this embodiment, the sidewalls of the isolation trenches 36 are masked, for instance with a photoresist mask, prior to nitridization. Subsequent to the nitridization step, the mask is stripped, and the oxidation step performed as previously discussed. In any case, loss of critical dimension of the stacks 14 due to oxidation of the polysilicon layers 20 is prevented during trench 36 oxidation by the nitride shield layers 28. In the embodiment disclosed in this paragraph, lengthy oxidation cycles produce thinner oxide layers in the isolation trenches 36, which can be desirable when it is desirable to control or limit the formation of the silicon oxide layer 40.

Figure 6:
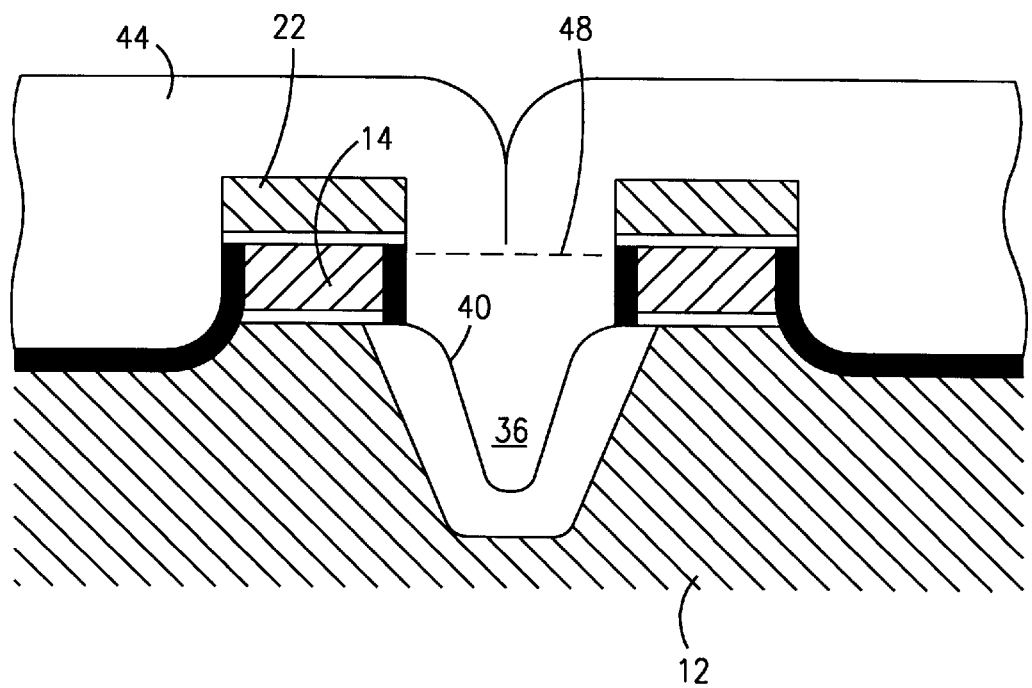
FIG. 6 is a cross-sectional representation of the semiconductor device after trench fill.

Following isolation trench 36 formation and oxidation, the completion of the semiconductor device 10 may proceed in any such manner as is required by its design. For example, as indicated at block 42 in FIG. 2 and as shown in FIG. 6, the trenches 40 are filled with an oxide 44 by chemical vapor deposition. Then, as indicated at block 46 of FIG. 2, the oxide 44 is polished down to the level indicated by the dashed line 48 in FIG. 6 by means known in the art, and then at block 50 in FIG. 2 the silicon nitride mask layer 22 of each stack 14 is stripped away using known means.

The principles of the present invention are equally applicable to a wide range of semiconductor and integrated circuit design and manufacture regimens, including but not necessarily limited to the production of non-volatile memory devices. All such implementations are specifically contemplated by the principles of the present intention.

The present invention has been particularly shown and described with respect to certain preferred embodiments of features thereof. However, it should be readily apparent to those of ordinary skill in the art that various changes and modifications in form and detail may be made without departing from the spirit and scope of the invention as set forth in the appended claims. In particular, the use of: alternate layer deposition or forming methodologies; etching technologies; masking methods; lithographic methods, passivation and nitridization techniques; as well as alternative semiconductor designs, as well as the application of the technology disclosed herein to alternate electronic components are all contemplated by the principles of the present invention. The invention disclosed herein may be practiced without any element which is not specifically disclosed herein. The use of the singular in the claims does not mean "only one", but rather "one or more", unless otherwise stated in the claims.

What is claimed is:

1. A method for fabricating a semiconductor device, the semiconductor device including a silicon substrate and plural stacks formed thereon, at least some stacks including at least one respective silicon layer in operative combination with the silicon substrate and defining a respective side edge, at least one isolation trench being formed between at least two adjacent stacks, comprising:

implanting a shield layer including nitrogen in at least one side edge of at least one silicon layer to protect the edge; and oxidizing the isolation trench, the shield layer protecting the edge of the respective silicon layer during trench oxidation.

2. The method of claim 1, wherein the implanting step is performed before the isolation trench is formed.

3. The method of claim 1, wherein the implanting step is performed after the isolation trench is formed.

4. The method of claim 1, wherein the implanting step includes rapid thermal annealing (RTA).

5. The method of claim 1, wherein the implanting step includes directing at least one plasma beam into at least one side edge of at least one silicon layer.

6. The method of claim 5, wherein the plasma beam establishes an angle with respect to a dimension normal to the substrate of between fifteen degrees and seventy five degrees (15°–75°).

7. The method of claim 6, wherein the angle is about sixty degrees (60°).

8. A method for making a semiconductor device, comprising:

providing a silicon substrate;

establishing plural component stacks on the substrate, at least some stacks defining respective side edges;

implanting at least one respective protective nitride layer on at least some of the edges of at least some of the stacks;

oxidizing isolation trenches in the substrate to electrically isolate at least some of the stacks from each other; and forming at least one isolation trench between at least two adjacent stacks, wherein the implanting step is performed after the isolation trench is formed.

9. The method of claim 8, wherein the forming step includes rapid thermal annealing (RTA).

10. The method of claim 8, wherein the forming step includes directing at least one plasma beam into at least one side edge of at least one stack.

11. The method of claim 10, wherein the plasma beam establishes an angle with respect to a dimension normal to the substrate of between fifteen degrees and seventy five degrees (15°–75°).

12. The method of claim 11, wherein the angle is about sixty degrees (60°).

13. A method for making a semiconductor device, comprising:

providing a silicon substrate;

establishing plural component stacks on the substrate, at least some stacks defining respective side edges;

implanting at least one respective protective nitride layer on at least some of the edges of at least some of the stacks;

oxidizing isolation trenches in the substrate to electrically isolate at least some of the stacks from each other; and forming at least one isolation trench between at least two adjacent stacks, wherein the implanting step is performed before the isolation trench is formed.

14. The method of claim 13, wherein the forming step includes rapid thermal annealing (RTA).

15. The method of claim 13, wherein the forming step includes directing at least one plasma beam into at least one side edge of at least one stack.

16. The method of claim 15, wherein the plasma beam establishes an angle with respect to a dimension normal to the substrate of between fifteen degrees and seventy five degrees (15°–75°).

17. The method of claim 16, wherein the angle is about sixty degrees (60°).

* * * * *